United States Patent
Hayashi et al.

(10) Patent No.: US 9,974,184 B2
(45) Date of Patent: May 15, 2018

(54) PRINTED BOARD, ELECTRONIC DEVICE, AND METHOD FOR MANUFACTURING ELECTRONIC DEVICE

(71) Applicant: FUJITSU LIMITED, Kawasaki-shi, Kanagawa (JP)

(72) Inventors: Mitsuaki Hayashi, Kawasaki (JP); Osamu Saito, Kawasaki (JP); Akira Okada, Kawasaki (JP); Junichi Hayama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/355,559

(22) Filed: Nov. 18, 2016

(65) Prior Publication Data
US 2017/0251554 A1   Aug. 31, 2017

(30) Foreign Application Priority Data
Feb. 29, 2016 (JP) .................... 2016-037149

(51) Int. Cl.
*H05K 1/18* (2006.01)
*H05K 3/34* (2006.01)
*H05K 3/00* (2006.01)

(52) U.S. Cl.
CPC ........... *H05K 1/183* (2013.01); *H05K 3/0044* (2013.01); *H05K 3/34* (2013.01); *H05K 2201/09036* (2013.01)

(58) Field of Classification Search
USPC ........................... 361/761; 174/260
See application file for complete search history.

(56) References Cited

U.S. PATENT DOCUMENTS

2007/0272436 A1* 11/2007 Matsui ............... H05K 1/116
174/260

FOREIGN PATENT DOCUMENTS

JP   9-46019   2/1997
JP   2014-187153   10/2014

\* cited by examiner

*Primary Examiner* — Andargie M Aychillhum
(74) *Attorney, Agent, or Firm* — Fujitsu Patent Center

(57) ABSTRACT

A printed board includes: a depression formed in at least one surface of a board; an open hole formed in the board so as to penetrate the board from a bottom portion of the depression; and a conductor formed over an edge of an opening portion of the open hole and an inner surface of the open hole.

10 Claims, 15 Drawing Sheets

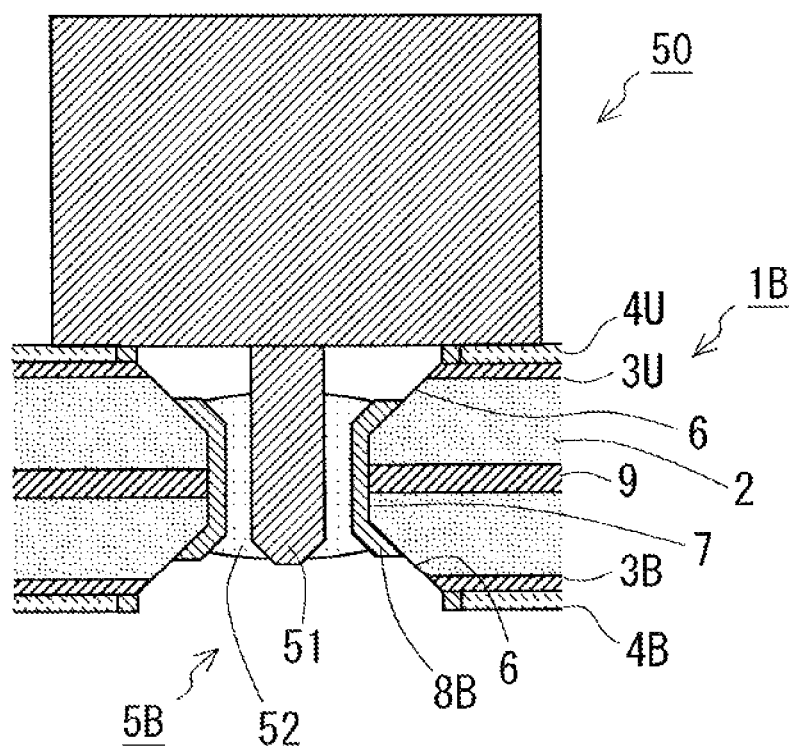

PRINTED BOARD, ELECTRONIC DEVICE, AND METHOD FOR MANUFACTURING ELECTRONIC DEVICE

CROSS-REFERENCE TO RELATED APPLICATION

This application is based upon and claims the benefit of priority of the prior Japanese Patent Application No. 2016-037149, filed on Feb. 29, 2016, the entire contents of which are incorporated herein by reference.

FIELD

The embodiments discussed herein relates to a printed board, an electronic device, and a method for manufacturing the electronic device.

BACKGROUND

Various manufacturing processes are performed on a printed board used in an electronic device.

Japanese Laid-open Patent Publication No. 9-46019 and Japanese Laid-open Patent Publication No. 2014-187153 discusses the related techniques.

SUMMARY

According to an aspect of the embodiments, a printed board includes: a depression formed in at least one surface of a board; an open hole formed in the board so as to penetrate the board from a bottom portion of the depression; and a conductor formed over an edge of an opening portion of the open hole and an inner surface of the open hole.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 15 illustrates an example of a printed board.

DESCRIPTION OF EMBODIMENT

Printed boards, on which electronic components are mounted, varies in thickness. For example, a thickness of a printed board including a plurality of wiring layers may increase with an increase in the number of wiring layers. Accordingly, in a case in which an electronic component provided with a terminal to be inserted into a through hole of a printed board is mounted on the printed board, depending on the thickness of the printed board, a tip of the terminal may not reach the back side of the printed board. It is difficult to visually perceive whether the terminal has been properly soldered to the through hole with solder when soldering is performed while the tip of the terminal of the electronic component is inside the though hole. The cost or the number of days taken for the component to be supplied may increase when, for example, a custom made electronic component that has a length corresponding to the thickness of the printed board or an electronic component including a press fit terminal is prepared.

A printed board or the like that enables visual perception of the soldered state of the terminal even in a case in which the length of the terminal of the electronic component to be mounted on the board does not correspond to the thickness of the board may be provided.

Figure 1:
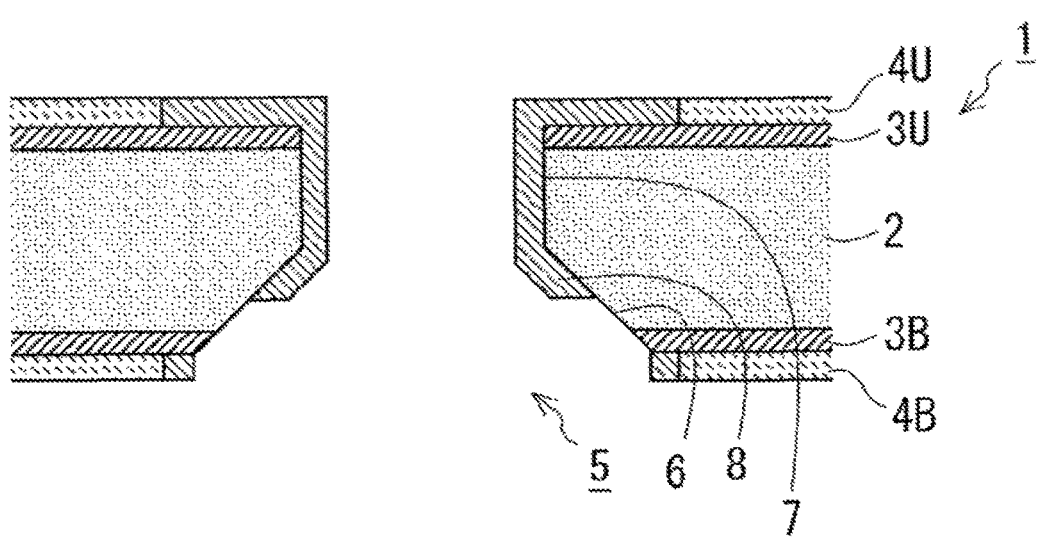
FIG. 1 illustrates an example of a printed board.

FIG. 1 illustrates an example of a printed board. A printed board 1 includes a plate-shaped base material 2 that is an insulator, pieces of copper foil 3U and 3B formed on surfaces of the base material 2, and resists 4U and 4B that cover surfaces of the pieces of copper foil 3U and 3B. The printed board 1 may be a board that is built in to various electronic devices. The electronic devices to which the printed board 1 is built in include all electronic products such as, for example, server system and network system devices, notebook-sized personal computers, smartphones, household electric appliances, medical equipment, game machines, on-vehicle equipment, and aviation instruments.

The printed board 1 includes a through hole 5. The through hole 5 includes a depression 6, an open hole 7, and plating 8. The plating 8 may be an example of a conductor. The depression 6 is a depression formed in one of the surfaces of the printed board 1. The depression 6 may be cone-shaped. The open hole 7 is a through hole formed so as to penetrate the printed board 1 from a bottom portion of the depression 6. The open hole 7 may be cylindrical. The plating 8 may be an electrical conductor formed on an edge of an opening portion of the open hole 7 inside the depression 6 and on an inner surface of the open hole 7. The edge of the opening portion of the open hole 7 is an area that is a portion of the inner surface of the depression 6 and an area that surrounds the opening portion of the open hole 7. The open hole 7 that penetrates the printed board 1 from the bottom portion of the depression 6 penetrates the printed board 1 in a direction orthogonal to the surface of the printed board 1. Accordingly, the base material 2 that is an insulator is exposed at the portion inside the depression 6 other than the edge of the opening portion of the open hole 7.

Figure 2:
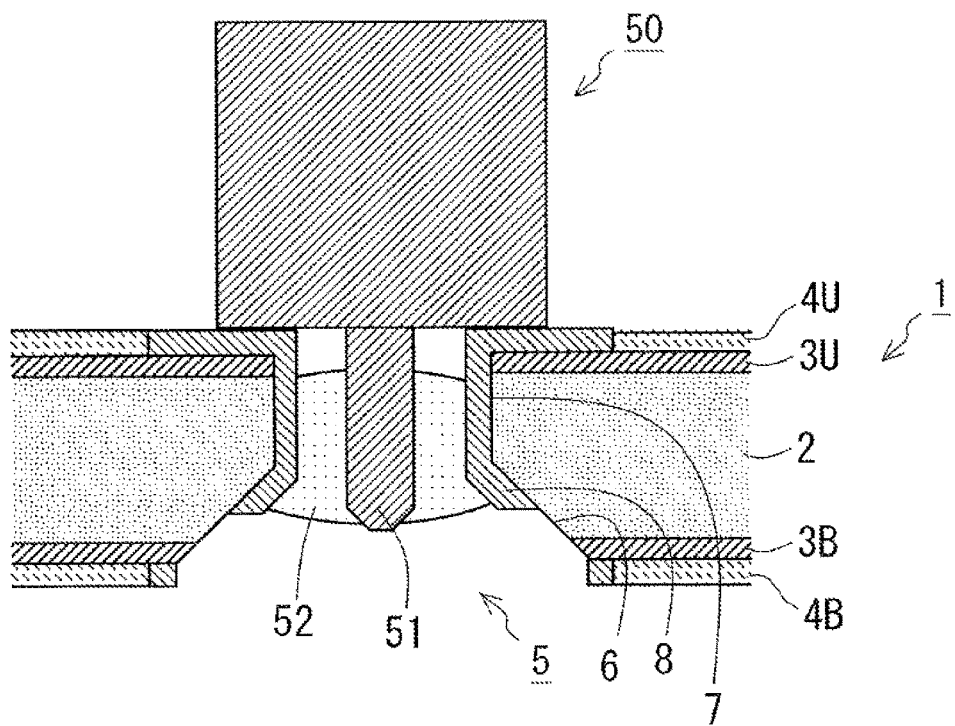
FIG. 2 illustrates an example of a printed board on which an electronic component is mounted.

FIG. 2 illustrates an example of a printed board on which an electronic component is mounted. A through hole 5 of the printed board 1 includes the depression 6. In a state in which a terminal 51 of an electronic component 50 is inserted into the through hole 5 from the side opposite the depression 6, the depression 6 may have a depth in such a degree that a tip of the terminal 51 appear inside the depression 6, for example. Accordingly, when the electronic component 50 is mounted on the printed board 1, at least the tip of the terminal 51 appears inside the depression 6. For example, as in the printed board 1 illustrated in FIG. 2, the electronic component 50 in which the length of the terminal 51 to be inserted into the through hole 5 is smaller than the thickness of the printed board 1 is mounted. In so doing, as long as at least the tip of the terminal 51 appear inside the depression 6, the soldered state of the solder 52 filled into the gap between the terminal 51 and the plating 8 may be visually perceived.

Figure 3:
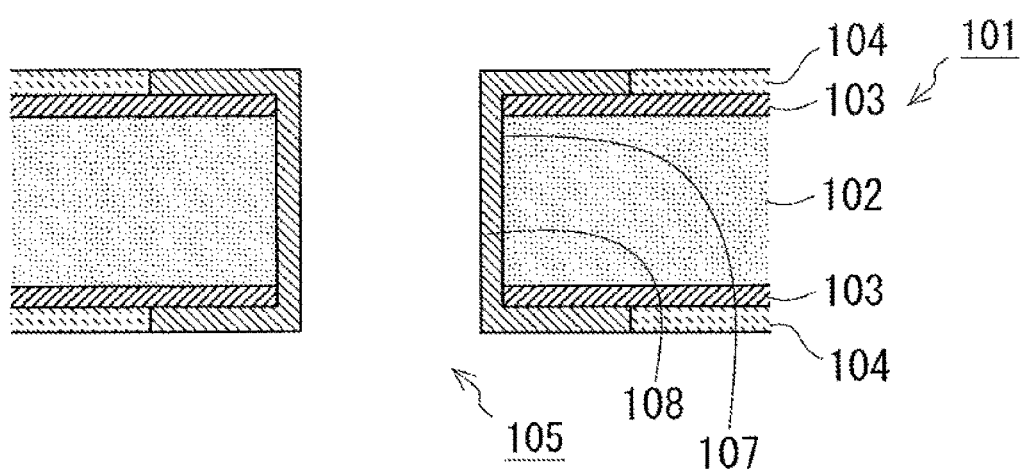
FIG. 3 illustrates an example of a printed board.

FIG. 3 illustrates an example of a printed board. A printed board 101 illustrated in FIG. 3 includes a plate-shaped base material 102, pieces of copper foil 103 formed on surfaces of the base material 102, and resists 104 that cover surfaces of the pieces of copper foil 103. The printed board 101 includes a cylindrical open hole 107 and a through hole 105 including plating 108 formed on an inner surface of the open hole 107. The through hole 105 is not provided with a depression corresponding to the depression 6 provided in the through hole 5 of the printed board 1 illustrated in FIGS. 1 and 2. Accordingly, when the electronic component 50 with the terminal 51 having a length that is smaller than a thickness of the printed board 101 is mounted on the printed board 101, the tip of the terminal 51 stays inside the open hole 107.

Figure 4:
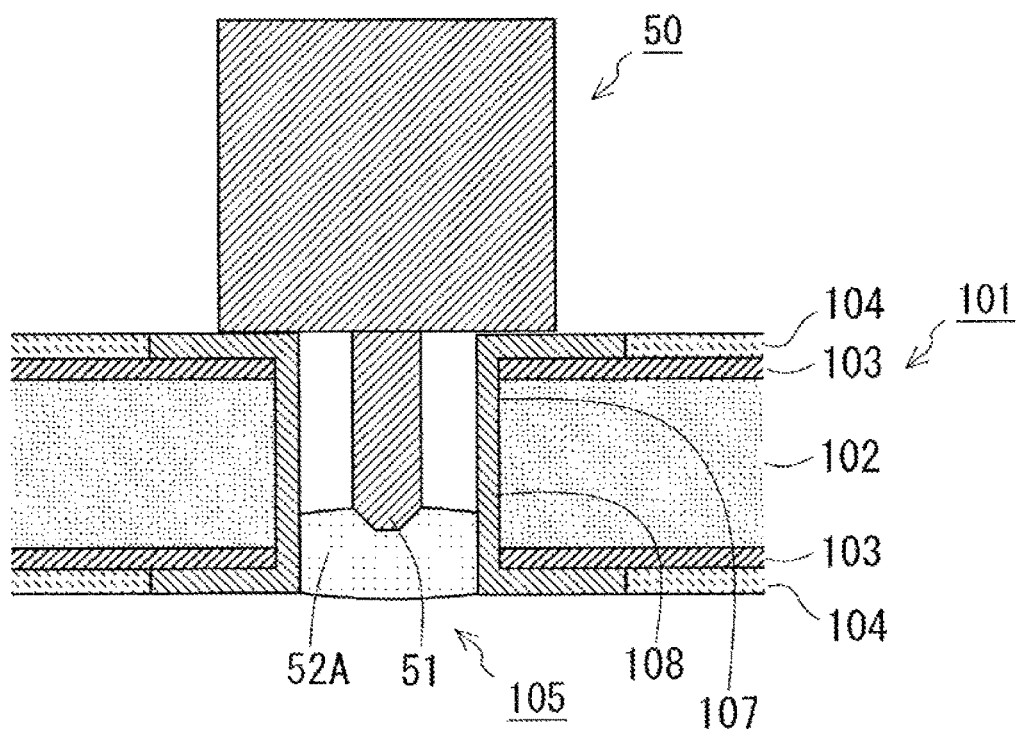
FIG. 4 illustrates an example of a printed board on which an electronic component is mounted.

FIG. 4 illustrates an example of a printed board on which an electronic component is mounted. For example, when soldering is performed on a though hole 105 while the tip of the terminal 51 stays inside the open hole 107, an opening portion of the open hole 107 is covered by solder 52A. Accordingly, the state of the terminal 51 soldered with the solder 52A may not be visually perceivable. For example, as illustrated in FIG. 4, even in a case of a poor solder in which the solder 52A is barely in contact with the terminal 51, the poor solder may be not be visually perceived.

Figure 5:
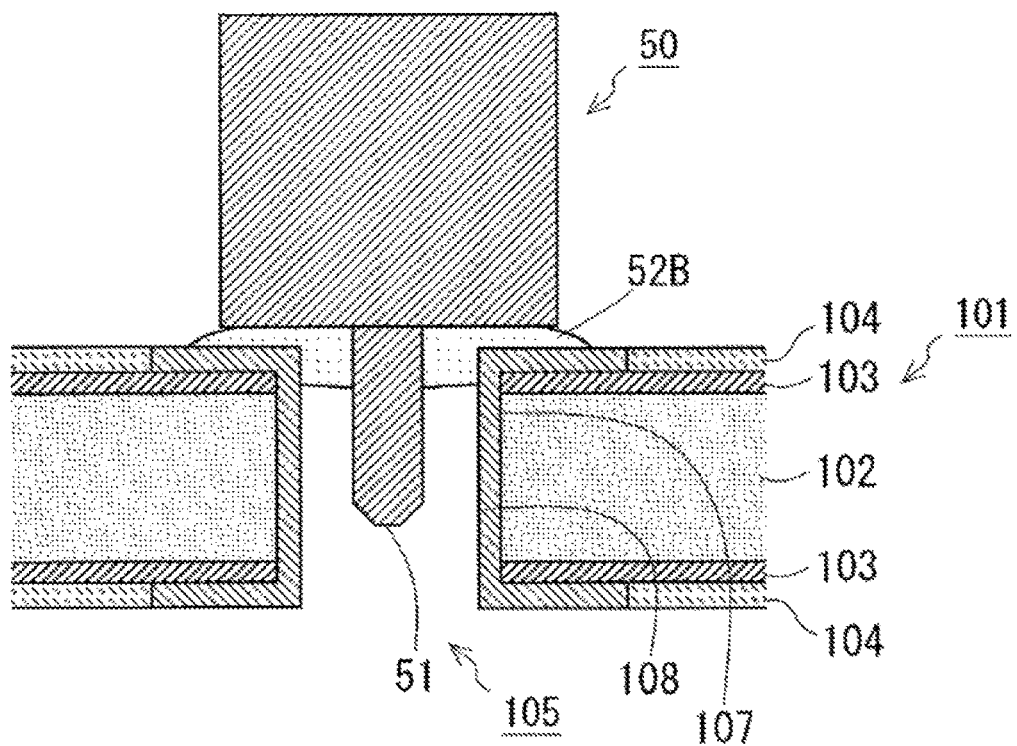
FIG. 5 illustrates an example of a printed board on which an electronic component is mounted.

FIG. 5 illustrates an example of a printed board on which an electronic component is mounted. For example, reflow is performed after the electronic component 50 is mounted on the printed board 101 in a state in which solder paste is applied to an edge of the opening portion of the open hole 107. As illustrated in FIG. 5, the solder paste that has been applied to the edge of the opening portion of the open hole 107 melts and solder 52B that solders the terminal 51 to the through hole 105 is formed. For example, although the opening portion of the open hole 107 is not covered with the solder 52B, the solder 52B is formed so as to be closer to the electronic component 50. Accordingly, the state of the terminal 51 soldered with the solder 52B may not be visually perceived. For example, as illustrated in FIG. 5, even in a case of a poor solder in which most of the terminal 51 is exposed from the solder 52B, the poor solder may be not be visually perceived.

Figure 6:
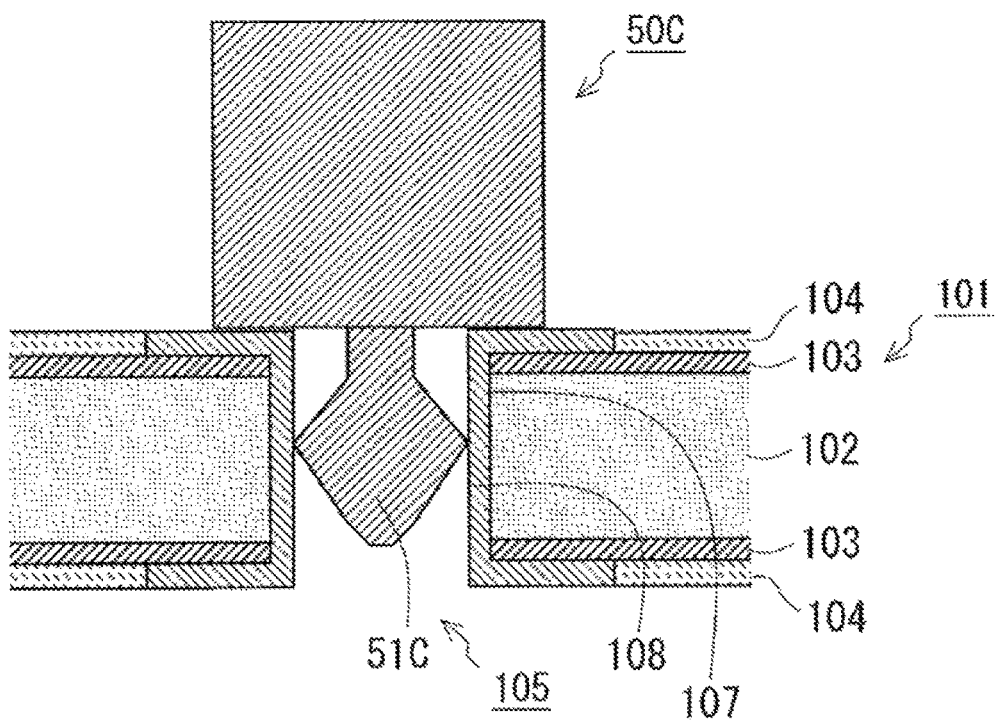
FIG. 6 illustrates an example of a printed board on which an electronic component is mounted.

FIG. 6 illustrates an example of a printed board on which an electronic component is mounted. Referring to FIG. 6, different from the electronic component 50 illustrated in FIGS. 1, 2, and 5, an electronic component 50C including a press fit terminal 51C is mounted. Since the terminal 51C is of a press fit type, mounting of the electronic component 50C on a printed board 101 is completed by press fitting the terminal 51C into the through hole 105. For example, in FIG. 6, soldering is not performed. The press fit terminal 51C is complex in structure compared with a merely rod-shaped terminal that is not of a press fit type. Accordingly, the cost and the number of days taken for the component to be supplied may increase.

For example, in the printed board 1 illustrated in FIGS. 1 and 2, at least the tip of the terminal 51 appears inside the depression 6 even if the electronic component 50 in which the length of the terminal 51 to be inserted into the through hole 5 is smaller than the thickness of the printed board 1 is mounted. Accordingly, the soldered state of the solder 52 filled into the gap between the terminal 51 and the plating 8 may be visually perceived. Even if the length of the terminal 51 to be inserted into the through hole 5 is smaller than the thickness of the printed board 1, the state of the terminal 51 soldered with the solder 52 may be visually perceived. Accordingly, even if an electronic component that includes a rod-like terminal that is not of the press fit type is employed as the electronic component 50, the soldered state of the terminal 51 may be visually perceived and the contact failure of the terminal 51 may be reduced.

Figure 7:
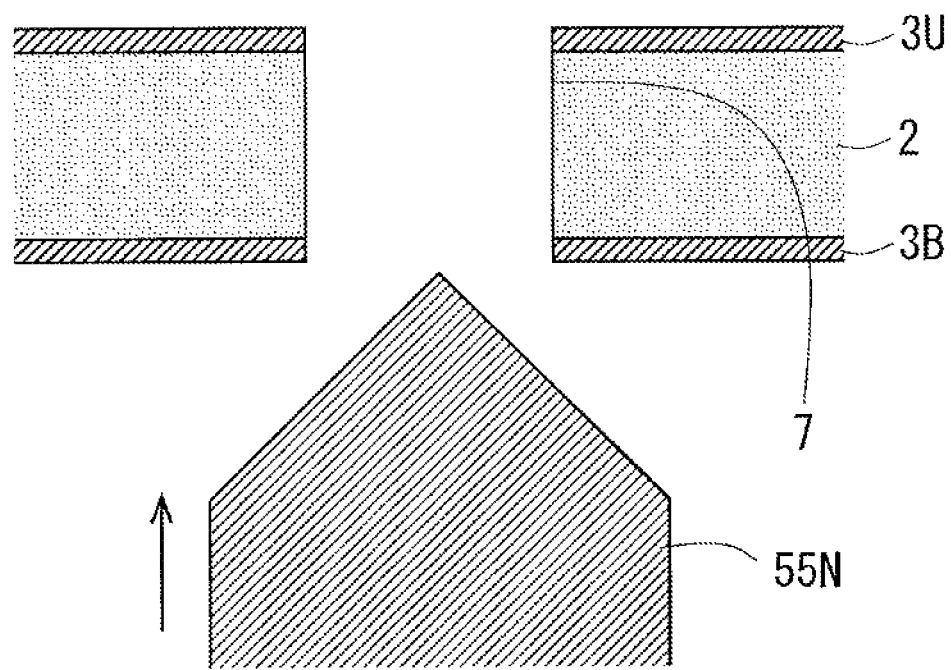
FIG. 7 illustrates an example of a manufacturing process of the printed board.

The printed board 1 described above may be manufactured in the following manner, for example. FIG. 7 illustrates an example of a manufacturing process of the printed board. In manufacturing the printed board described above, for example, the base material 2 having two surfaces on which the pieces of copper foil 3U and 3B are formed and in which the open hole 7 is formed is prepared. A drill 55N that has a diameter that is larger than the diameter of the open hole 7 approaches the opening portion of the open hole 7.

Figure 8:
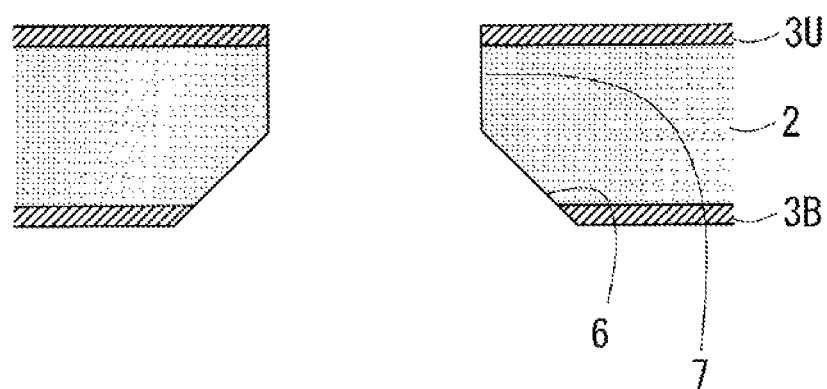
FIG. 8 illustrates an example of a manufacturing process of the printed board.

FIG. 8 illustrates an example of a manufacturing process of the printed board. When the drill 55N comes into contact with the opening portion of the open hole 7, the opening portion of the open hole 7 is cut away with the drill 55N and the depression 6 is formed in the base material 2. The portion that is cut away with the drill 55N is a portion in the vicinity of the opening portion of the open hole 7. Not all of the open hole 7 is cut away but a portion remains. Accordingly, the open hole 7 is formed so as to penetrate the base material 2 from the bottom portion of the depression 6.

Figure 9:
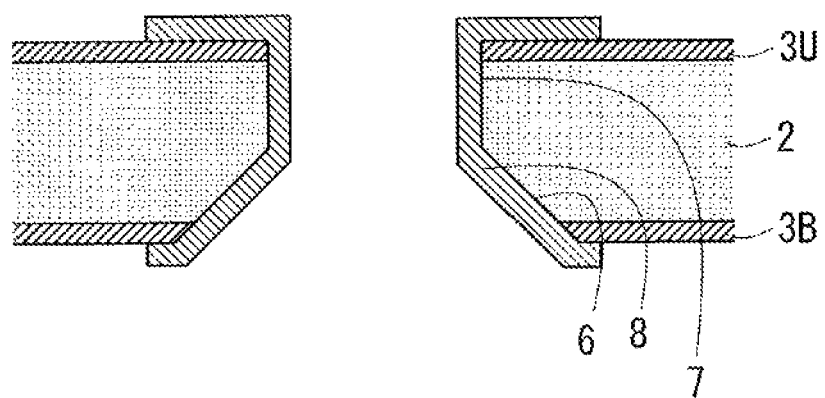
FIG. 9 illustrates an example of a manufacturing process of the printed board.

FIG. 9 illustrates an example of a manufacturing process of the printed board. After the depression 6 has been formed, in FIG. 9, the plating 8 is formed on the inner surface of the depression 6 and the inner surface of the open hole 7.

Figure 10:
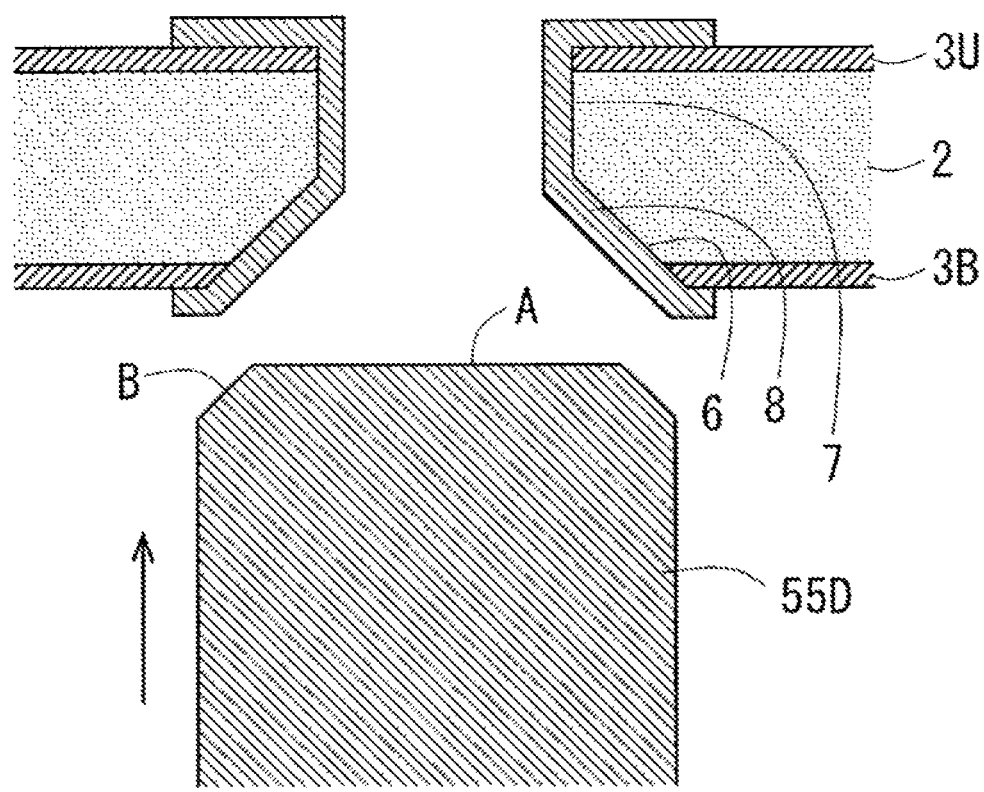
FIG. 10 illustrates an example of a manufacturing process of the printed board.

FIG. 10 illustrates an example of a manufacturing process of the printed board. After the plating 8 has been formed, in FIG. 10, the plating other than that on the edge of the opening portion of the open hole 7 inside the depression 6 is cut away. The cutting away of the plating is performed with a drill 55D having a trapezoidal tip in side view. A drill having a pointed tip may be used as the drill 55D; however, a drill in which the tip has a flat shape extending along a surface orthogonal to a central axis of the drill 55D may be used as well (see symbol A in FIG. 10). The tip of the drill 55D is shaped so that the cone-shaped portion slightly remains (see symbol B in FIG. 10). When the drill 55D approaches and comes into contact with the depression 6, among the plating formed on the inner surface of the depression 6, the plating on the portion other than the edge of the opening portion of the open hole 7 inside the depression 6 is cut away. Upon formation of the resists 4U and 4B, the printed board 1 illustrated in FIG. 1 is completed.

Figure 11:
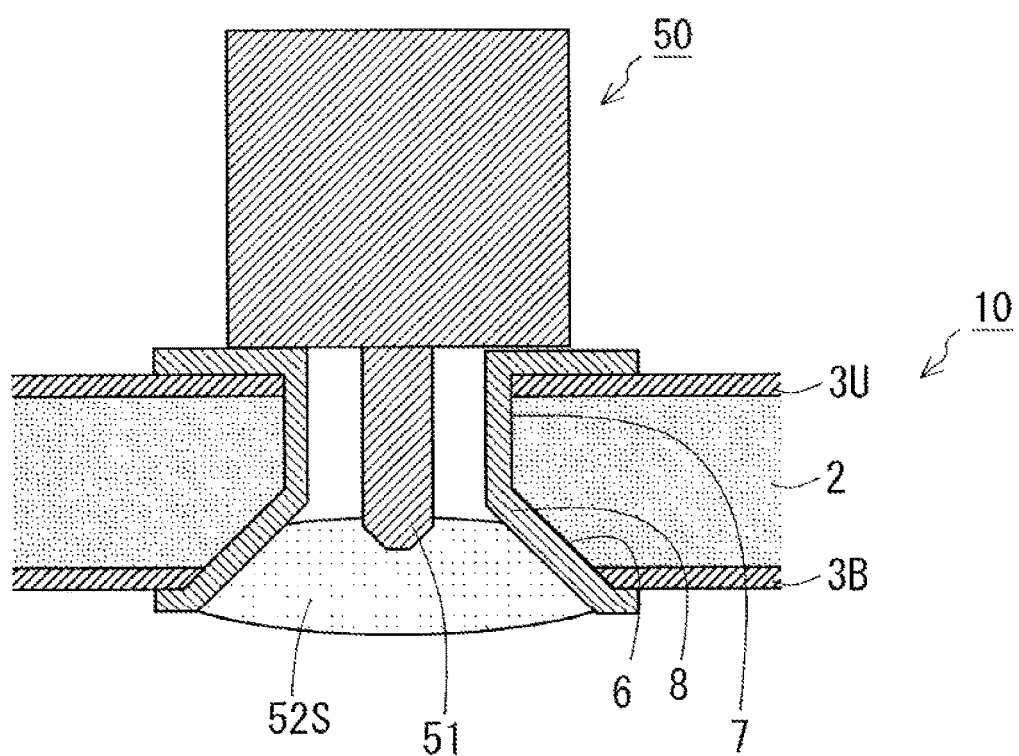
FIG. 11 illustrates an example of a printed board on which an electronic component is mounted.

FIG. 11 illustrates an example of a printed board on which an electronic component is mounted. The electronic component 50 is mounted on a printed board 10, for example, the board in the state illustrated in FIG. 9, before the plating is cut away with the drill 55D, and soldering is performed. Solder 52S drenches and spreads over the entire plating that covers the inner surface of the depression 6. When the solder 52S drenches and spreads over the entire plating that covers the inner surface of the depression 6, the tip of the terminal 51 is covered and hidden with the solder 52S. For example, as is the case of the printed board 1, when the base material 2 is exposed at a portion of the inner surface of the depression 6 other than the edge of the opening portion of the open hole 7, the solder 52S drenching and spreading over the inner surface of the depression 6 stays at the edge portion of the opening portion of the open hole 7. Accordingly, the tip of the terminal 51 may not be covered and hidden by the solder 52.

Figure 12:
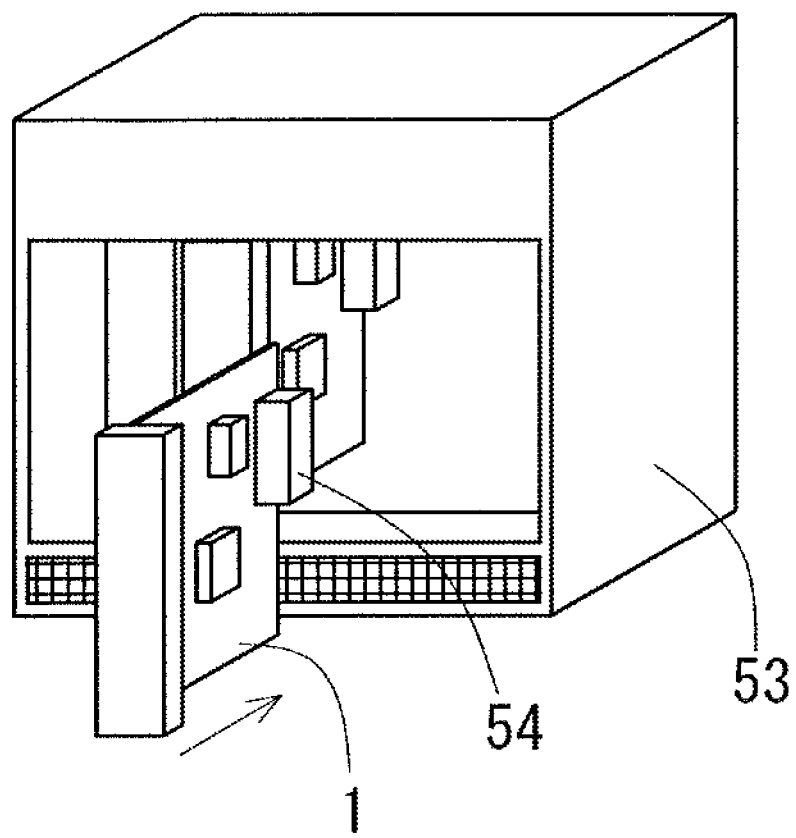
FIG. 12 illustrates an example of an electronic device on which a printed board has been mounted.

FIG. 12 illustrates an example of an electronic device on which a printed board has been mounted. The printed board 1 may be mounted in a plug-in unit 53 illustrated in FIG. 12, for example. The plug-in unit 53 may be an example of the electronic device. The printed board 1 mounted in the plug-in unit 53 is electrically coupled to an electronic circuit inside the plug-in unit 53 through a connector 54 fixed to the printed board 1. Multiple terminals are formed throughout the length and breadth of the connector 54. In a case in which the electronic component 50 is the connector 54 including multiple terminals like this, a semiconductor package, or another electronic component of another type, the printed board 1 may be provided with a plurality of through holes 5.

Figure 13:
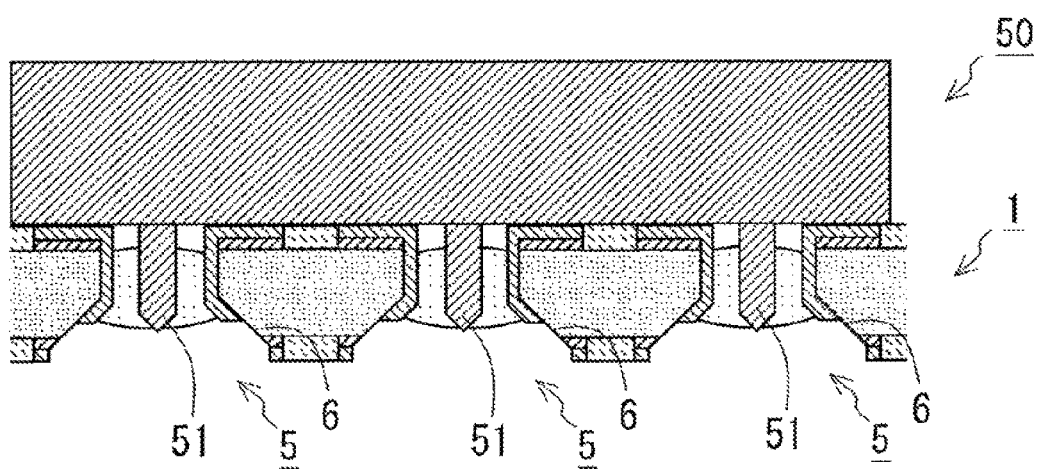
FIG. 13 illustrates an example of a printed board on which an electronic component including a plurality of terminals is mounted.

FIG. 13 illustrates an example of a printed board on which an electronic component including a plurality of terminals is mounted. In a case in which the electronic component 50 includes the plurality of terminals 51, through holes 5 of the printed board 1 are formed at respective appropriate positions that correspond to the respective terminals 51. For example, since each through hole 5 includes the depression 6, when the distance between the terminals 51 are small, the depressions 6 of the respective through holes may come into contact with each other. Accordingly, when the electronic component 50 including the plurality of terminals 51 is mounted, the depression 6 of each through hole 5 may be formed with an appropriate dimension according to the distance between the terminals 51 and the length of each terminal 51.

Figure 14:
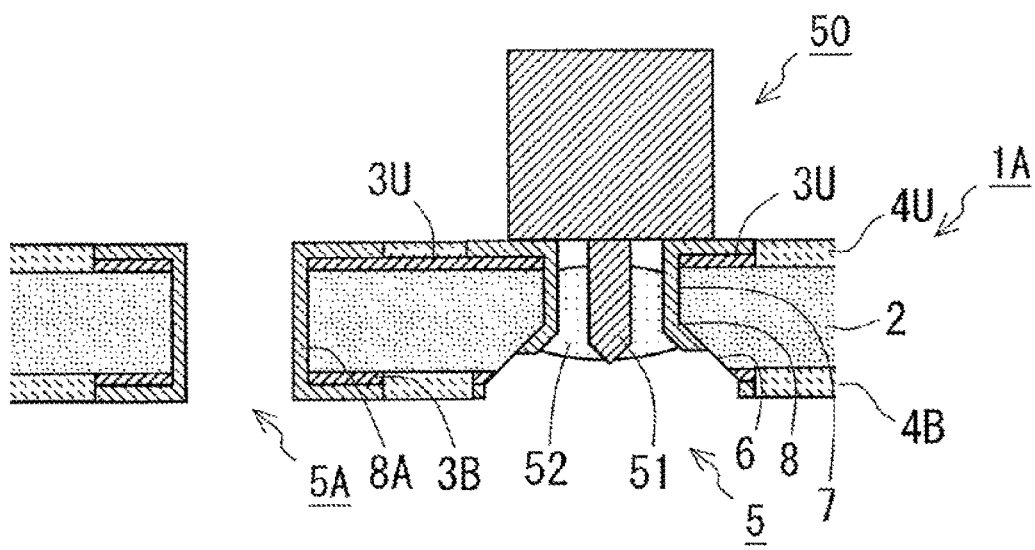
FIG. 14 illustrates an example of a printed board.

For example, in the though hole 5 provided in the printed board 1, there is the plating 8 inside the depression 6 on the edge of the opening portion of the open hole 7 inside the depression 6; however, there is no plating 8 around the edge. Accordingly, in order to communicate the wiring formed with the copper foil 3B on the surface of the two surfaces of the printed board 1 on which the electronic component 50 is not mounted, and the terminal 51 to each other, the printed board 1 may be configured in the following manner. FIG. 14 illustrates an example of a printed board. As illustrated in FIG. 14, a printed board 1A illustrated in FIG. 14 is provided with a though hole 5A having no depression 6 next to the through hole 5. The plating 8 of the through hole 5 and plating 8A of the through hole 5A are electrically coupled to each other through the copper foil 3U. The plating 8A of the through hole 5A is in contact with the pieces of copper foil 3U and 3B each formed on the respective one of the two surfaces of the printed board 1. Accordingly, the plating 8 of the through hole 5 is in electrical communication with the copper foil 3B through the copper foil 3U and he plating 8A. In the printed board 1A illustrated in FIG. 14, the copper foil 3B formed on the surface on which the electronic component 50 is not mounted, and the terminal 51 of the electronic component 50 are electrically coupled to each other.

FIG. 15 illustrates an example of a printed board. A printed board 1B illustrated in FIG. 15 includes a through hole 5B provided with a depression 6 described above in each of the two surfaces of the printed board 1B. When the through hole 5B is provided in each of the two surfaces of the printed board 1B, the electronic component 50 may be mounted on any one of the two surfaces of the printed board 1. For example, since the depression 6 is provided on each of the two surfaces of the printed board 1B, plating 8B of the through hole 5B is not in contact with the pieces of copper foil 3U and 3B. For example, in the printed board 1B illustrated in FIG. 15, a wiring layer 9 that is electrically coupled to the plating 8B of the though hole 5B is layered inside the printed board 1B.

In the printed board 1A illustrated in FIG. 14 and the printed board 1B illustrated in FIG. 15, similar to the printed board 1 illustrated in FIG. 1 or 2, the tip of the terminal 51 is not covered and hidden by the solder 52. Accordingly, the soldered state of the terminal 51 may be visually perceived and the contact failure of the terminal 51 may be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A printed board comprising: a depression formed in at least one surface of a board; an open hole formed in the board so as to penetrate the board from a bottom portion of the depression; and a first conductor formed over an edge of an opening portion of the open hole and an inner surface of the open hole wherein a first area of the depression at the one surface of the board is larger than a second area of the depression at the bottom portion in such a manner that the depression has a tapered shape, wherein the first conductor is formed on an inner surface of the depression in a vicinity of the bottom portion on an open hole side and is not formed on the inner surface of the depression in the vicinity of an opening portion of the depression on a one surface side of the board.

2. The printed board according to claim 1, wherein an insulator is exposed at a portion of the open hole other than the edge of the opening portion.

3. The printed board according to claim 1, wherein in a state in which a terminal of an electronic component is inserted into the open hole from a side opposite the depression, the depression has a depth in which a tip of the terminal is present inside the depression.

4. The printed board according to claim 1, wherein the board includes a plate-shaped base containing an insulator, second conductors provided on respective surfaces of the plate-shaped base and resist layers which covers the respective second conductors.

5. The printed board according to claim 4, wherein one of the second conductors provided on a side of the one surface of the board is covered by one of the resist layers and the first conductor.

6. An electronic device comprising: a printed board including a depression formed in at least one surface of the printed board, an open hole formed in the printed board so as to penetrate the printed board from a bottom portion of the depression, and a first conductor formed over an edge of an opening portion of the open hole and an inner surface of the open hole; an electronic component including a terminal which is inserted into the open hole from a side opposite the depression; and solder that fills a gap between the terminal and the first conductor, wherein a first area of the depression at the one surface of the printed board is larger than a second area of the depression at the bottom portion in such a manner that the depression has a tapered shape, wherein the first conductor is formed on an inner surface of the depression in a vicinity of the bottom portion on an open hole side and is not formed on the inner surface of the depression in the vicinity of an opening portion of the depression on a one surface side of the printed board.

7. The electronic device according to claim 6, wherein an insulator is exposed at a portion of the open hole other than the edge of the opening portion.

8. The electronic device according to claim 6, wherein in a state in which a terminal of the electronic component is inserted into the open hole from a side opposite the depression, the depression has a depth in which a tip of the terminal is present inside the depression.

9. The electronic device according to claim 6, wherein the printed board includes a plate-shaped base containing an insulator, second conductors provided on respective surfaces of the plate-shaped base and resist layers which covers the respective second conductors.

10. The electronic device according to claim 9, wherein one of the second conductors provided on a side of the one surface of the printed board is covered by one of the resist layers and the first conductor.

\* \* \* \* \*